United States Patent
Yan et al.

(10) Patent No.: US 9,462,694 B2
(45) Date of Patent: Oct. 4, 2016

(54) SPACER LAYER FOR EMBEDDING SEMICONDUCTOR DIE

(71) Applicant: SANDISK SEMICONDUCTOR (SHANGHAI) CO., LTD., Shanghai (CN)

(72) Inventors: Junrong Yan, Shanghai (CN); Weili Wang, Shanghai (CN); Li Wang, Shanghai (CN); Pradeep Rai, Jangipur (IN); Xin Lu, Shanghai (CN); Jianbin Gu, Shanghai (CN); Peng Lu, Shanghai (CN)

(73) Assignee: SanDisk Semiconductor (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 14/561,768

(22) Filed: Dec. 5, 2014

(65) Prior Publication Data

US 2015/0187421 A1    Jul. 2, 2015

(30) Foreign Application Priority Data

Dec. 30, 2013 (CN) .......................... 2013 1 0743148

(51) Int. Cl.
*G11C 16/02* (2006.01)
*H05K 1/18* (2006.01)
*H01L 25/065* (2006.01)

(52) U.S. Cl.
CPC ............ *H05K 1/181* (2013.01); *H01L 25/065* (2013.01); *H01L 2224/05553* (2013.01); *H01L 2224/05554* (2013.01); *H01L 2224/48091* (2013.01); *H01L 2224/48145* (2013.01); *H01L 2224/48227* (2013.01); *H01L 2224/49175* (2013.01); *H05K 2201/10159* (2013.01); *H05K 2201/10515* (2013.01); *H05K 2201/2018* (2013.01); *Y02P 70/611* (2015.11); *Y10T 428/24273* (2015.01)

(58) Field of Classification Search
None
See application file for complete search history.

(56) References Cited

U.S. PATENT DOCUMENTS

| | | | |
|---|---|---|---|
| 7,064,430 B2 | 6/2006 | Chow et al. | |
| 7,223,626 B2 | 5/2007 | Farnworth et al. | |
| 7,687,897 B2 | 3/2010 | Ha et al. | |
| 7,915,084 B2 | 3/2011 | Hong | |
| 8,186,051 B2 | 5/2012 | Aleksov et al. | |
| 2003/0047798 A1* | 3/2003 | Halahan | H01L 23/481 257/685 |
| 2005/0127563 A1 | 6/2005 | Hirosawa et al. | |
| 2005/0224959 A1 | 10/2005 | Kwon et al. | |
| 2006/0035415 A1* | 2/2006 | Wood | H01L 27/14618 438/125 |
| 2006/0267173 A1 | 11/2006 | Takiar et al. | |
| 2007/0231970 A1 | 10/2007 | Fukuo et al. | |
| 2009/0032925 A1 | 2/2009 | England | |
| 2011/0095440 A1 | 4/2011 | Upadhyayula et al. | |

(Continued)

OTHER PUBLICATIONS

STATSChipPAC, "Fine Pitch Ball Grid Array—Stacked Die", Mar. 2013.

(Continued)

*Primary Examiner* — Khaja Ahmad
(74) *Attorney, Agent, or Firm* — Vierra Magen Marcus LLP

(57) ABSTRACT

A semiconductor device, and a method of its manufacture, are disclosed. The semiconductor device includes a semiconductor die, such as a controller die, mounted on a surface of a substrate. A spacer layer is also mounted to the substrate, with the semiconductor die fitting within an aperture or a notch formed through first and second major opposed surfaces of the spacer layer. Additional semiconductor die, such as flash memory die, may be mounted atop the spacer layer.

22 Claims, 20 Drawing Sheets

(56) References Cited

U.S. PATENT DOCUMENTS

| | | | |
|---|---|---|---|
| 2011/0215470 A1* | 9/2011 | Chen | H01L 23/52 257/738 |
| 2012/0032350 A1* | 2/2012 | Warren | H01L 23/3677 257/782 |
| 2012/0306038 A1 | 12/2012 | Chow et al. | |
| 2013/0157413 A1 | 6/2013 | Upadhyayula et al. | |
| 2014/0048951 A1* | 2/2014 | Lin | H01L 23/481 257/774 |
| 2015/0155222 A1* | 6/2015 | Shealy | H01L 23/481 257/76 |

OTHER PUBLICATIONS

Haba, Belgacem, Ph.D, "Bridging Technology between 3D Conventional Stacking and TSV 3D Stacking", Mar. 4, 2013.
Crisp, Richard, "Invensas Corporation DIMM in a Package Technology: Driving Down Ultrabook Platform Cost", Oct. 12, 2011.
Response to Office Action filed Apr. 12, 2016 in Taiwan Patent Application No. 103144379.
Office Action dated Jan. 8, 2016 in Taiwan Patent Application No. 103144379.

* cited by examiner

SPACER LAYER FOR EMBEDDING SEMICONDUCTOR DIE

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

A cross-sectional side view and a top view of a conventional semiconductor package 20 are shown in FIGS. 1 and 2 (without molding compound in FIG. 2). Typical packages include a plurality of semiconductor die, such as flash memory die 22 and a controller die 24, affixed to a substrate 26. A plurality of die bond pads 28 may be formed on the semiconductor die 22, 24 during the die fabrication process. Similarly, a plurality of contact pads 30 may be formed on the substrate 26. Die 22 may be affixed to the substrate 26, and then die 24 may be mounted on die 22. All die may then be electrically coupled to the substrate by affixing wire bonds 32 between respective die bond pad 28 and contact pad 30 pairs. Once all electrical connections are made, the die and wire bonds may be encapsulated in a molding compound 34 to seal the package and protect the die and wire bonds.

In order to most efficiently use package footprint, it is known to stack semiconductor die on top of each other, either completely overlapping each other, or with an offset as shown in FIGS. 1 and 2. In an offset configuration, a die is stacked on top of another die so that the bond pads of the lower die are left exposed. An offset configuration provides an advantage of convenient access of the bond pads on each of the semiconductor die in the stack. While two memory die are shown in the stack in FIG. 1, it is known to provide more memory die in the stack, such as for example four or eight memory die.

In order to increase memory capacity in semiconductor packages while maintaining or reducing the overall size of the package, the size of the memory die has become large compared to the overall size of the package. As such, it is common for the footprint of the memory die to be almost as large as the footprint of the substrate.

The controller die 24 is generally smaller than the memory die 22. Accordingly, the controller die 24 is conventionally placed at the top of the memory die stack. This configuration has certain drawbacks. For example, is difficult to form a large number of wire bonds from the die bond pads on the controller die down to the substrate. It is known to provide an interposer or redistribution layer beneath the controller die so that wire bonds are made from the controller die to the interposer, and then from the interposer down to the substrate. However, this adds cost and complexity to the semiconductor device fabrication. Moreover, the relatively long length of the wire bonds from the controller die to the substrate slows down operation of the semiconductor device.

DETAILED DESCRIPTION

The present technology will now be described with reference to FIGS. 3 through 34, which in embodiments, relate to a semiconductor device including a semiconductor die, such as a controller, mounted on a surface of a substrate. A spacer layer is also mounted to the substrate. In one embodiment, the substrate-mounted semiconductor die may fit within an aperture formed through first and second opposed surfaces of the spacer layer. In a further embodiment, the substrate-mounted semiconductor die they fit within a notch formed through a portion of an edge of the spacer layer. The spacer layer of either embodiment may be formed and cut from a semiconductor wafer in embodiments of the present technology. Once a spacer layer is affixed to the substrate, one or more additional semiconductor die may be mounted on top of the spacer layer.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal" as may be used herein are by way of example and illustrative purposes only, and are not meant to limit the description of the invention inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25%.

Figure 6:
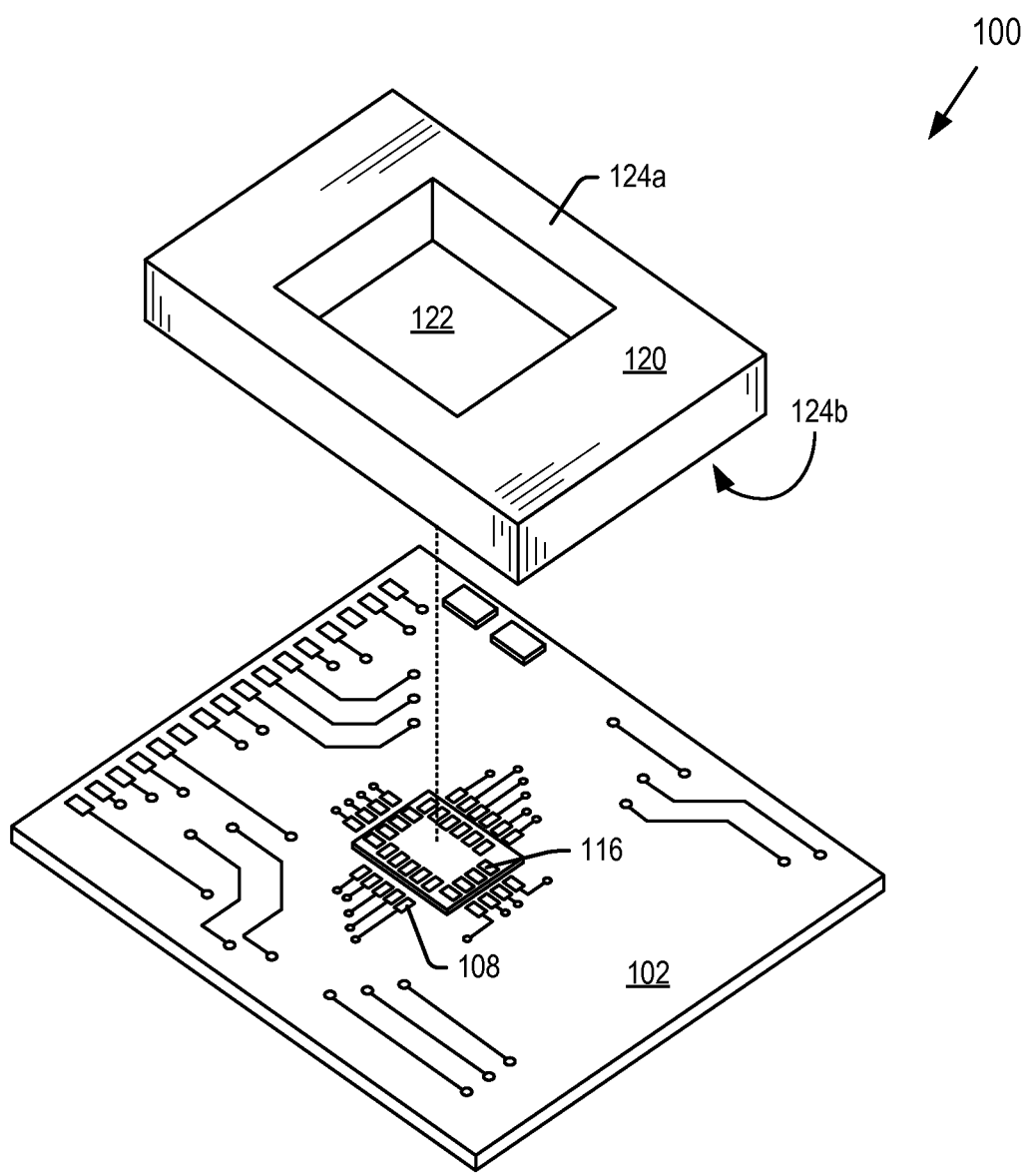
FIG. 6 is a perspective view of a stage in the fabrication of a semiconductor device according to an alternative embodiment of the present technology.
Figure 7:
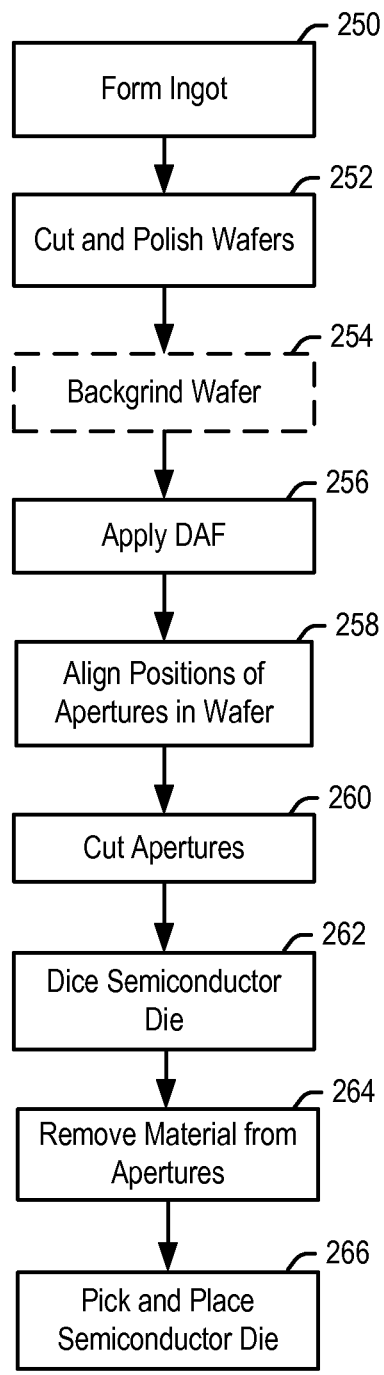
FIG. 7 is a flowchart for forming spacer layers from a semiconductor wafer according to embodiments of the present technology.
Figure 8:
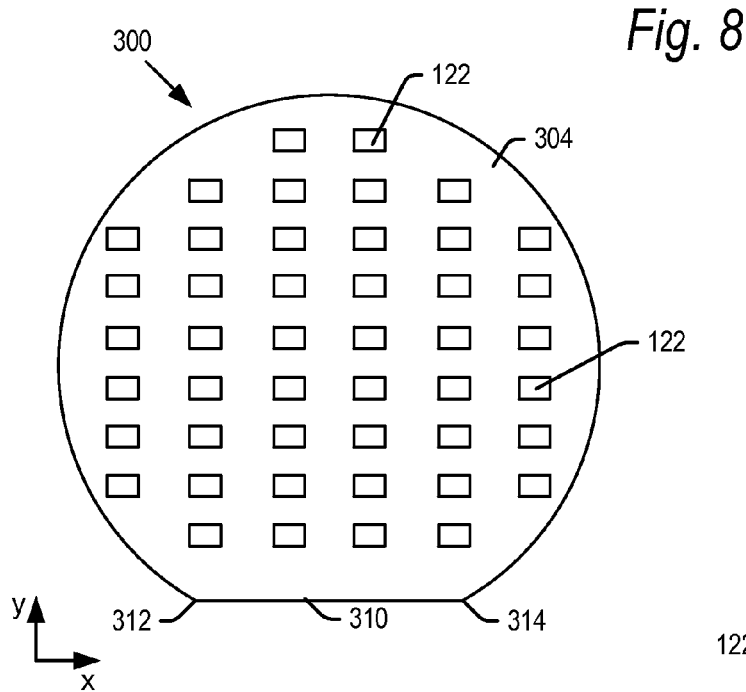
FIGS. 8, 9 and 10 are top, back and perspective views of a partially processed wafer including apertures according to an embodiment of the present technology.

An embodiment of the present invention will now be explained with reference to the flowcharts of FIGS. 3 and 7, and the views of FIGS. 4-6 and 8-22. Although the figures show an individual semiconductor device 100, or a portion thereof, it is understood that the device 100 may be batch processed along with a plurality of other devices 100 on a substrate panel to achieve economies of scale. The number of rows and columns of semiconductor devices 100 on the substrate panel may vary.

Figure 4:
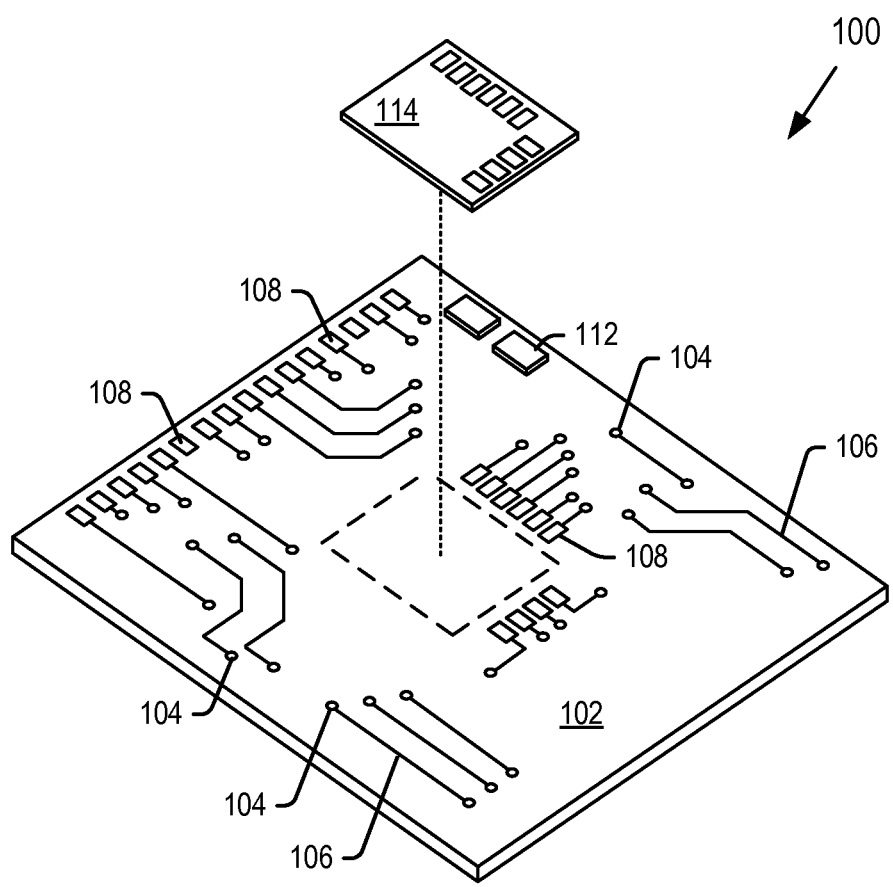
FIG. 4 is a perspective view of a stage in the fabrication of a semiconductor device according to an embodiment of the present technology.
Figure 5:
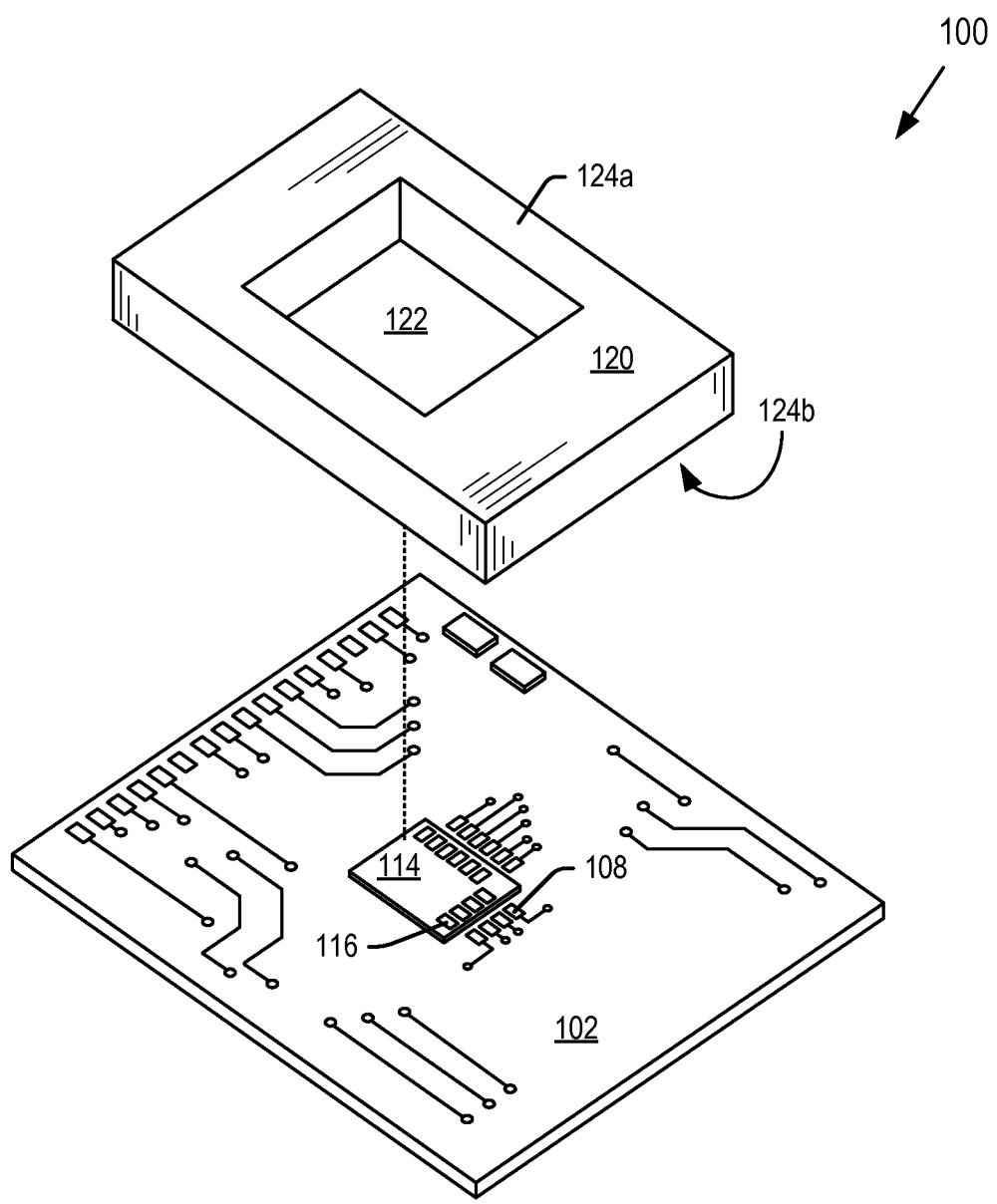
FIG. 5 is a perspective view of a further stage in the fabrication of a semiconductor device according to an embodiment of the present technology.

The substrate panel may begin with a plurality of substrates 102 (again, one such substrate is shown in FIGS. 4-5 for example). The substrate 102 may be a variety of different chip carrier mediums, including a printed circuit board (PCB), a leadframe or a tape automated bonded (TAB) tape. The substrate may include a plurality of vias 104, electrical traces 106 and contact pads 108. The substrate 102 may include many more vias 104, traces 106 and pads 108 (only some of which are numbered in the figures), and they may be in different locations than are shown in the figures.

Figure 1:
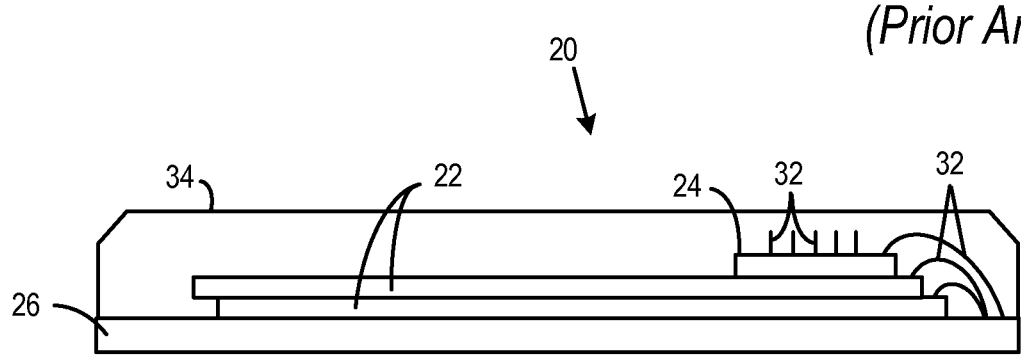
FIG. 1 is a prior art edge view of a conventional semiconductor device including a pair of semiconductor die stacked in an offset relation.
Figure 2:
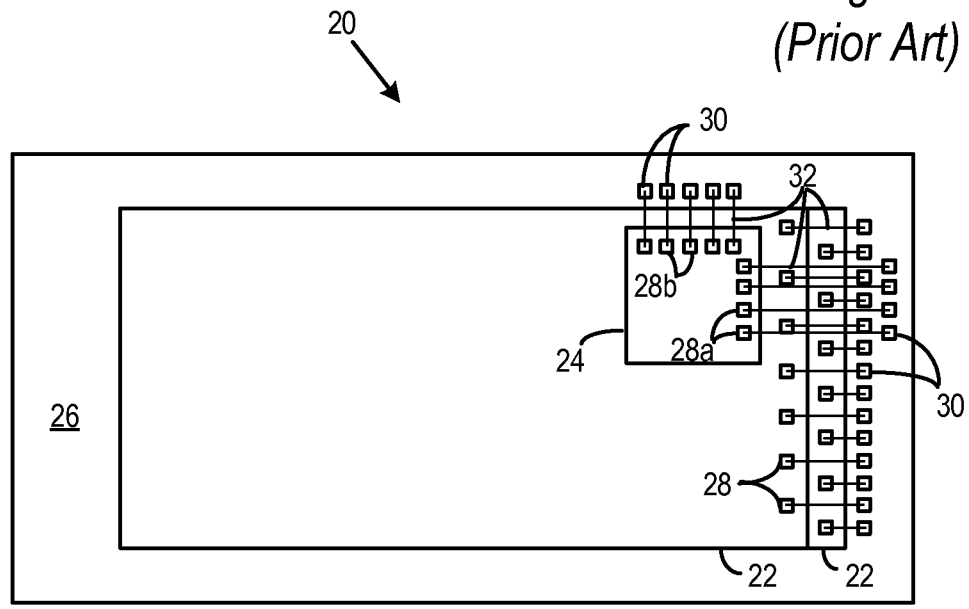
FIG. 2 is a prior art edge view of a conventional semiconductor device including a pair of semiconductor die stacked in an overlapping relation and separated by a spacer layer.
Figure 3:
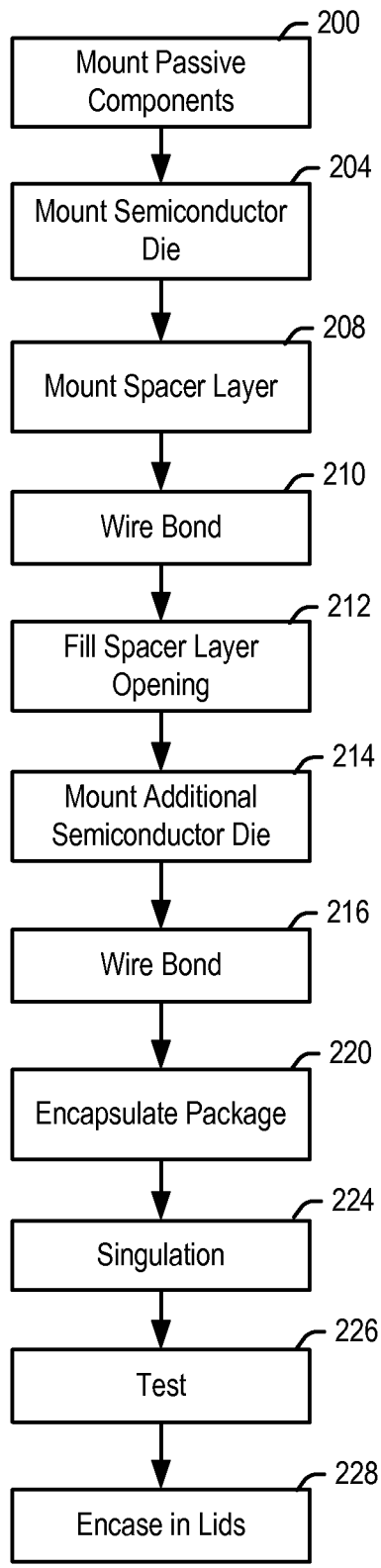
FIG. 3 is a flowchart for forming a semiconductor die according to embodiments of the present invention.

Referring to the flowchart of FIG. 3, passive components 112 may be affixed to the substrate 102 in a step 200. The one or more passive components may include for example one or more capacitors, resistors and/or inductors, though other components are contemplated. The passive components 112 shown (only one of which is numbered in the figures) are by way of example only, and the number, type and position may vary in further embodiments. The passive components 112 may extend above the surface of the substrate 102. As such they may be mounted outside of the footprint of the spacer layer explained below. Alternatively, the passive components may be positioned on the substrate 102 so as to fit within the aperture of the spacer layer mounted on the substrate as is also explained below.

In step 204, a semiconductor die 114 may be mounted on a surface of the substrate 102. The semiconductor die 114 may also be positioned on the substrate 102 so as to fit within the aperture of the spacer layer when the spacer layer is mounted on the substrate. The semiconductor die 114 may be a controller ASIC. However, die 114 may be other types of semiconductor die, such as a DRAM or NAND.

FIG. 5 shows the semiconductor die 114 mounted on the substrate 102. The semiconductor die 114 includes die bond pads 116, one of which is labeled for example in FIG. 5. The number of die bond pads 116 shown is for clarity only, and it is understood that there may be more contact pads 108 and die bond pads 116 in further embodiments. Moreover, while semiconductor die 114 is shown with die bond pads 116 on two sides in FIG. 5, it is understood that semiconductor die 114 may have die bond pads 116 on all four sides of the semiconductor die 114 in further embodiments, for example as shown in FIG. 6. The semiconductor die 114 may alternatively have die bond pads 116 on one side or three sides in further examples.

In accordance with the present technology, a spacer layer 120 may next be mounted to the substrate 102 in step 208. The spacer layer 120 is formed with an aperture 122 extending through the spacer layer, between opposed top and bottom major surfaces 124a, 124b of the spacer layer 120. The spacer layer 120 may be mounted on the substrate 102 so that the semiconductor die 114 (and possibly other structures on the surface of substrate 102) sit within the aperture 122.

It is a feature of the present technology that the spacer layer 120 may be a semiconductor die formed from a semiconductor wafer. One advantage of this feature is that the spacer layer may be made of the same material as other semiconductor die mounted on top of the spacer layer as explained hereinafter, thereby avoiding thermal mismatch. A further advantage is that the fabrication facilities that make the semiconductor device 100 typically have tools and processes for handling semiconductor wafers. Thus, formation of the spacer layers 120 from a semiconductor wafer involves minimal additional cost and processing steps for the fabrication facility.

Referring now to FIGS. 7-10, spacer layers 120 may be formed from semiconductor wafer 300. A semiconductor wafer 300 may start as an ingot of wafer material which may be formed in step 250. In one example, the ingot may be polycrystalline silicon. However, in further embodiments, it is contemplated that the ingot from which the wafers 300 are formed may be monocrystalline silicon grown according to either a Czochralski (CZ) or floating zone (FZ) process.

In addition to silicon, it is understood that wafer 300 may be formed of any other semiconductor element or compound including but not limited to Group IV elemental semiconductors, Group IV compound semiconductors, Group VI elemental semiconductors, III-V semiconductors, II-VI semiconductors, I-VII semiconductors, IV-VI semiconductors, V-VI semiconductors, and II-V semiconductors. Additionally, as the wafer 300 is used to form a mechanical spacer layer 120, the spacer layer 120 may be a variety of materials beyond semiconductor elements or compounds.

Figure 9:
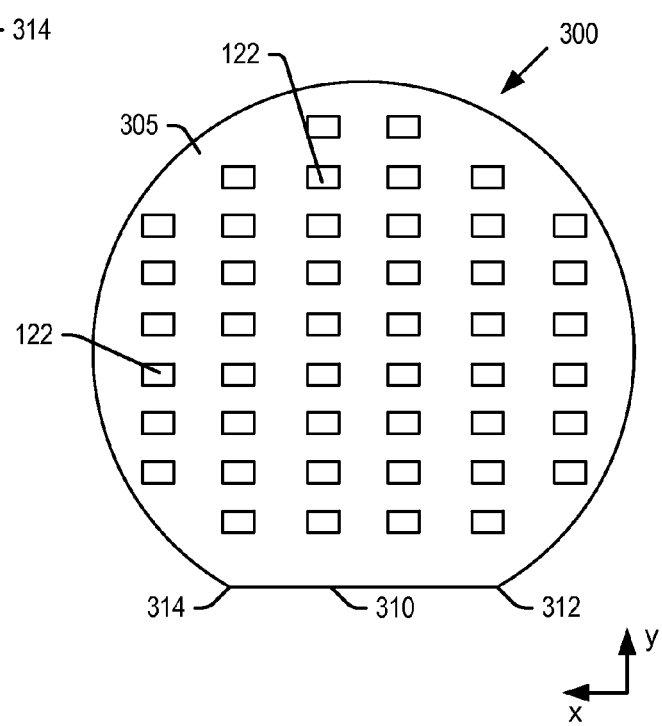

In step 252, the semiconductor wafer 300 may be cut from an ingot and polished on both major surfaces to provide smooth surfaces. Wafer 300 may have a first major surface 304 (FIG. 8) and an opposite second major surface 305 (FIG. 9). In step 254, a grinding wheel may be applied to the second major surface 305 to backgrind the wafer 300 from, for example, 780 µm to 280 µm, though these thicknesses are by way of example only and may vary in different embodiments. This step is shown in dashed lines as this step may be skipped in embodiments. It is also conceivable that the backgrind step 254 be performed later in the process, for example after the apertures 122 are cut and removed as explained below.

A layer of die attach film (DAF) may be applied to a surface of the wafer 300 in step 256. The DAF layer will be used to attach the spacer layers 120 to the substrates 102 once the spacer layers 120 are diced from wafer 300 as explained below.

In step 258, the positions of the apertures 122 to be formed (some of which are numbered in FIGS. 8-10) are aligned to the wafer. For example, the positions of the apertures 122 may be set so as to align with the known finished positions of the semiconductor die that are to be diced from the wafer. This alignment may be done by a number of different methods. In one example, reference positions may be defined on the wafer 300 and all positions of semiconductor die and apertures 122 may be defined in relation to these reference points.

For example, wafer 300 typically includes a flat 310 (FIGS. 8-10) for identifying and orienting the crystalline structure of the wafer for processing. The flat 310 ends at points, referred to as cleave points, where the rounded portion of the wafer 300 meets the flat 310. The first and second major surfaces 304, 305 have cleave points 312 and 314 (they are shown flipped with respect to each other in the views of FIGS. 8 and 9 as the wafer 300 is flipped over in the view of FIG. 9 relative to FIG. 8).

The positions of the semiconductor die as diced may be defined relative to one or both cleave points 312, 314. Thereafter, the positions of the apertures 322 may be aligned to the positions of the semiconductor die by positioning them at known distances along the x- and y-axes relative to the cleave points 312 and/or 314. Thus, apertures 322 may be precisely positioned within each semiconductor die, for example centered within each die when the die are diced from the wafer 300.

In step 260, apertures 122 are formed through the wafer 300 with either the first or second major surfaces 304, 305 facing upwards. The dimensions of the apertures 122 may vary, depending on the size of the semiconductor die 114 (and possibly other components) that are to seat within the apertures. In one example including a semiconductor die 114 having wire bonds extending off of all four sides of the die 114 as explained below, apertures 122 may be sized so that there is at least a 250 µm space between the sidewalls of the apertures 122 and the contact pads 108 on the substrate 102 that receive the wire bonds from the die 114. These dimensions are by way of example only and may vary. Moreover, the dimensions of the apertures 122 may be smaller where there are wire bonds extending from less than all four sides of the die 114.

Figure 19:
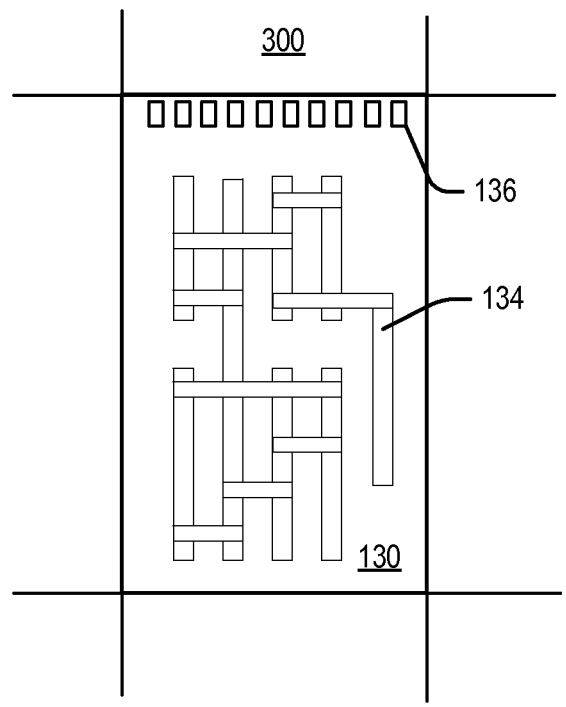
FIGS. 19-20 illustrate partial views of a wafer including reclaimed semiconductor die having defective integrated circuits according to embodiments of the present technology.
Figure 20:
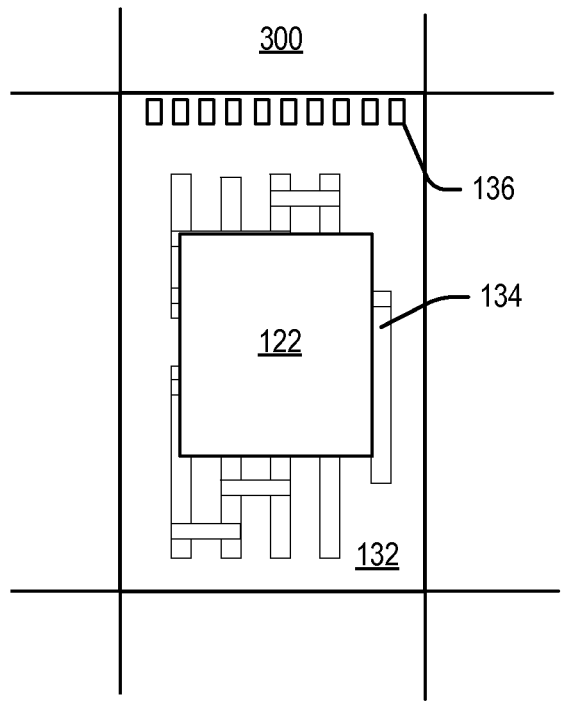
Figure 21:
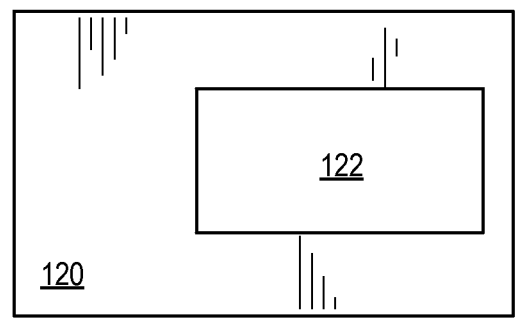
FIGS. 21-22 illustrate views of an alternative embodiment of the spacer layer according to embodiments of the present technology.
Figure 22:
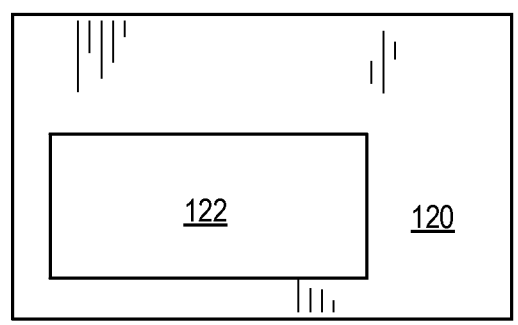
Figure 23:
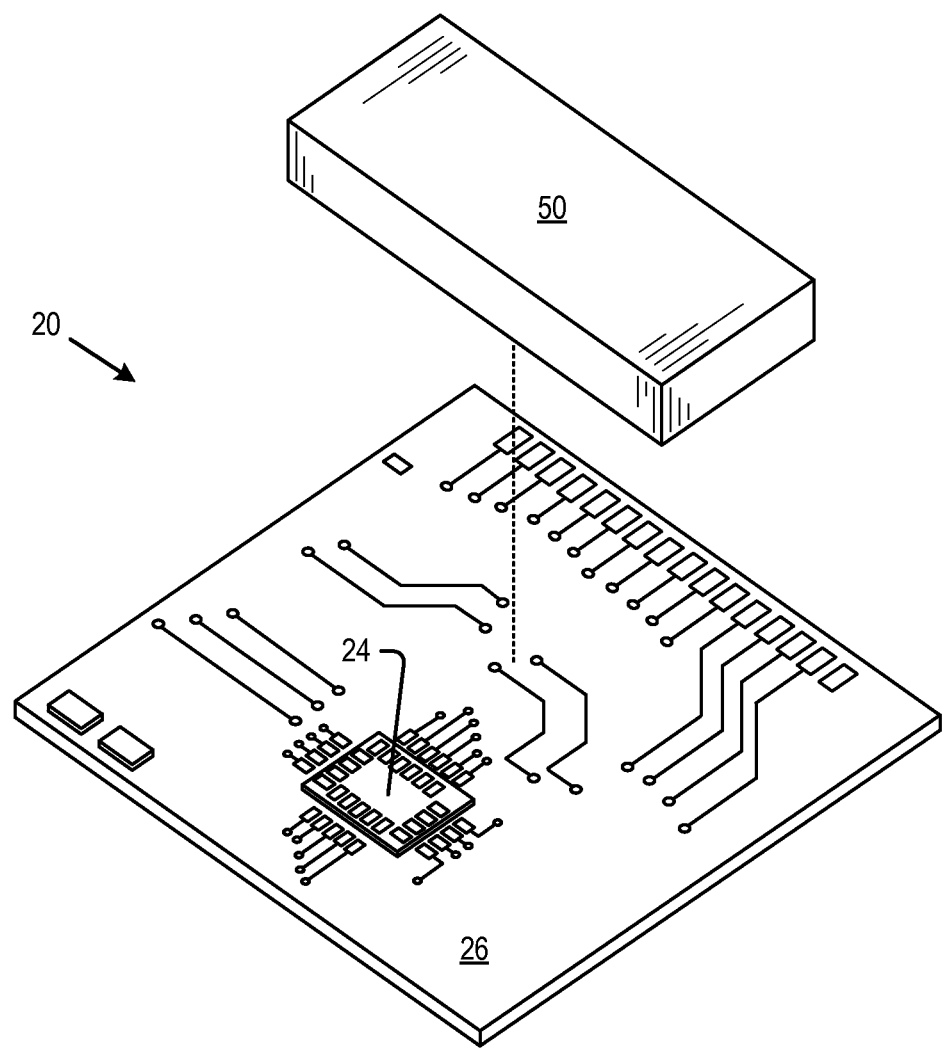
FIGS. 23-26 are prior art views of a semiconductor device including a conventional spacer layer providing on the substrate for a substrate-mounted semiconductor die.
Figure 24:
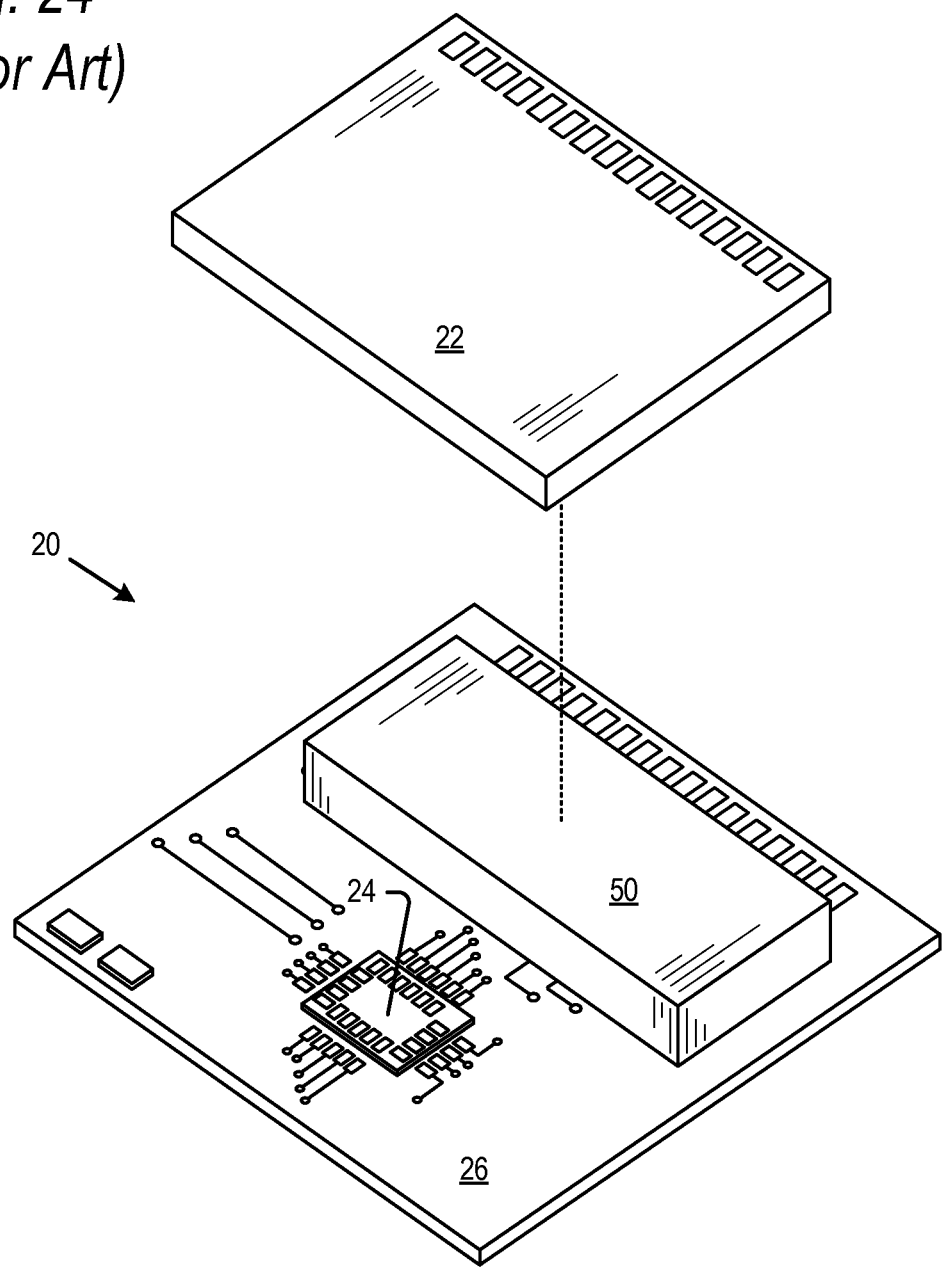
Figure 25:
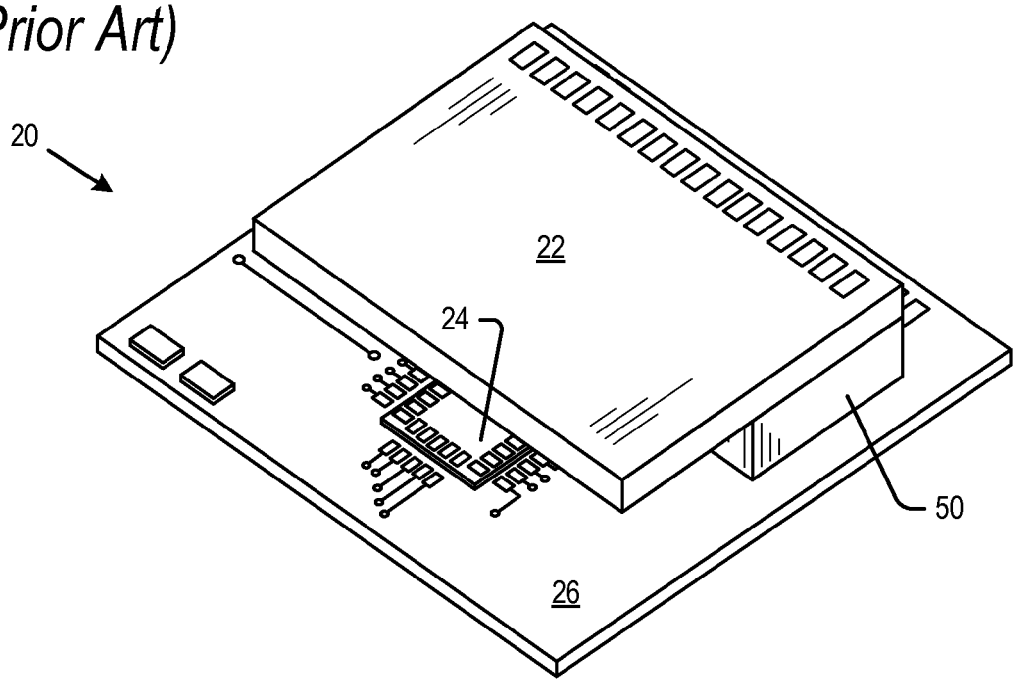

In embodiments, the apertures may be spaced apart from each other such that, once the wafer 300 is diced as explained below, each aperture 122 is positioned in the same location in the resultant spacer layers 120. As noted above, the apertures 122 may be centered in each spacer layer in one embodiment. Alternatively, apertures 122 may instead be closer to one edge than the opposed edge along the length and/or width of the spacer layers 120 in further embodiments. Two examples of this are shown in FIGS. 19 and 20.

Figure 10:
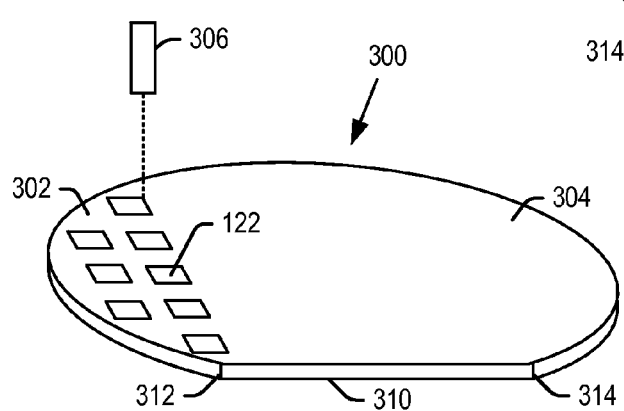
Figure 11:
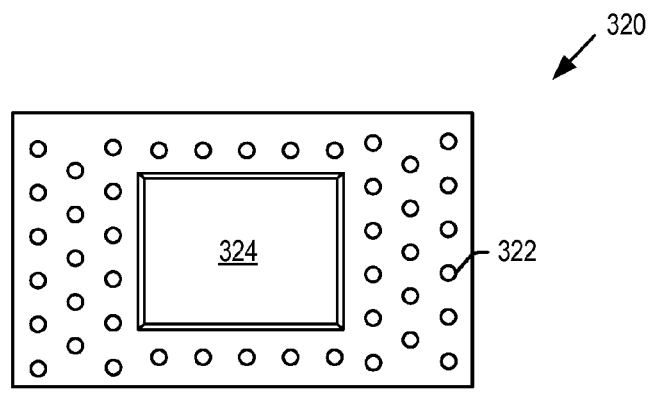
FIG. 11 is a bottom view of a vacuum tip of a tool for picking up spacer layers according to an embodiment of the present technology.

The aperture 122 may be formed by a variety of different technologies. In one example, the apertures 122 may be formed with a laser 306 (FIG. 10). The laser 306 may for example be a high power $CO_2$ laser using repetitive short frequency pulses to cut successively deeper through the wafer 300 and the DAF layer. In one embodiment, the laser wavelength may be between 335 nm and 395 nm, and the pulses may cycle on and off at a frequency of 80 KHz to 130 KHz. It is understood that this wavelength range and frequency range are by way of example only, and one or both may vary above or below these ranges in further embodiments. The wafer 300 may be mounted on a chuck within a table that controllably translates in the X and Y directions while the laser is held stationary to form the apertures 122 with desired dimensions. A single laser may be used to form each of the apertures 122 in the wafer 300, or more than one laser may be used simultaneously to improve throughput.

In a further embodiment, the apertures 122 may be etched out of the wafer 300. The apertures may be etched in a variety of different processes, including for example using a liquid etchant, a dry plasma etchant or a vapor etchant. In one example, a photoresist (not shown) is applied across the entire first major surface 304 (though it may be the second major surface 305 in further examples). After aligning an aperture mask (not shown) over the photoresist on the first major surface 304, the photoresist and aperture mask may be exposed to an ultra violet light. The photoresist is then developed which results in the optical pattern of the aperture mask being transferred as open windows (not shown) in the photoresist. The entire first major surface 304 of the wafer 300 is then exposed to a selective etch that cuts the apertures through the wafer 300 without affecting the photoresist. The photoresist is removed in a stripping process to yield the apertures 122 through the wafer 300.

In one embodiment, the process for etching apertures 122 may be an anisotropic etch which can result in apertures 122 having rectangular or approximately rectangular sidewalls. In further embodiments, the process may be an isotropic etch which can result in apertures 122 having more rounded sidewalls (rounded in a plane parallel to major surfaces 304, 305, and/or rounded in a cross-sectional view through the wafer 300).

After the apertures 122 are formed, the wafer 300 may be diced in step 262 into individual semiconductor die to be used as spacer layers 120. The wafer 300 may be diced using a saw blade in a known dicing process.

In the dicing step, the wafer 300 may be held on a wafer chuck with the second major surface 305 including the DAF layer held against the wafer chuck so that the respective semiconductor die remain in position on the chuck after dicing. Thereafter, in step 264, a pick and place robot having a first vacuum tip may remove the wafer portions from the interior of the apertures 122 that were cut as explained above. In further embodiments, it is possible that the material from the interior of the apertures be removed before the wafer 300 is diced.

In step 266 a pick and place robot having a second vacuum tip may remove the semiconductor die, now comprising finished spacer layers, from the vacuum chuck and place them on the substrate as explained below. An example of a vacuum tip 320 for removing the spacer layers 120 from the vacuum chuck is shown from a bottom view in FIG. 11. The vacuum tip 320 includes vacuum holes 322 connected to a negative pressure source. The vacuum tip 320 also includes an opening 324 which overlies the aperture 122 when vacuum tip 320 picks the spacer layer 120 from the vacuum chuck. Other configurations of vacuum tip 320 are contemplated.

Figure 12:
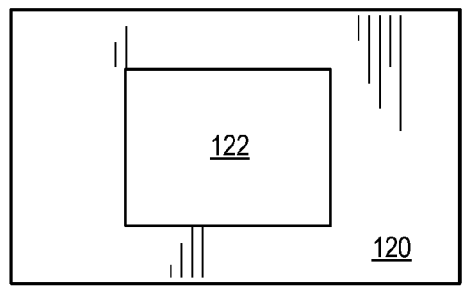
FIGS. 12-13 are top and perspective views of a spacer layer according to an embodiment of the present technology.
Figure 13:
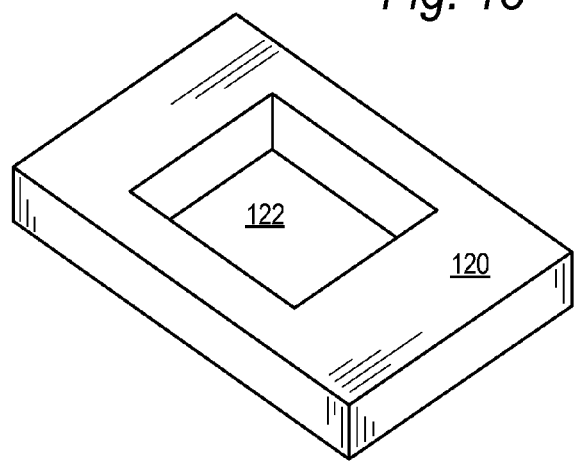

FIGS. 12 and 13 show top and perspective views of a finished spacer layer 120 including aperture 122. Referring again to the flowchart of FIG. 3 and perspective view of FIG. 14, a spacer layer 120 may be mounted to the substrate 102 in step 208 by curing the DAF layer. The spacer layer is positioned on the substrate 102 so that the semiconductor die 114 is positioned within the aperture.

In embodiments, the semiconductor die 114 may have a thickness of 46 μm. The die attach film attaching the semiconductor die 114 may have a thickness of 10 μm. The spacer layer 120 may have a thickness so that the semiconductor die 114, and any wire bonds off of the semiconductor die 114, are completely contained within the aperture 122 (i.e., do not extend above a plane of the top surface 124a of the spacer layer 120). In embodiments, the spacer layer 120 may have a thickness of 102 μm, and the DAF layer affixing the spacer layer 120 to the substrate 102 may have a thickness of 20 μm. Each of these dimensions may vary in further embodiments with the provision that the semiconductor die 114 and any wire bond from die 114 are contained within the aperture 122.

Figure 14:
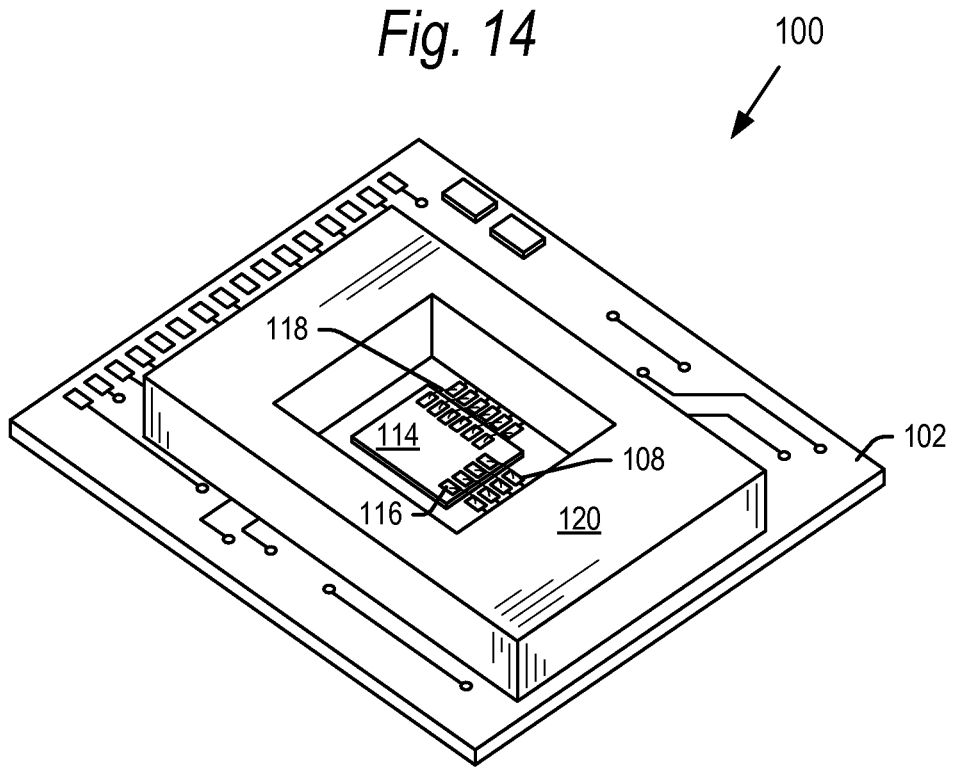
FIG. 14 is a perspective view of a further stage in the fabrication of a semiconductor device according to an embodiment of the present technology.

In step 210, the die bond pads 116 on semiconductor die 114 may be electrically coupled to contact pads 108 on the substrate 102 via wire bonds 118, one of which is numbered in FIG. 14. Wire bonding may be performed by a wire bond capillary (not shown) forming the wire bonds 118 while extending through the aperture 122. The space between the contact pads 108 and the side walls of the aperture 122 may be sufficiently large as explained above to allow the capillary to form the wire bonds without contacting the side walls of the aperture 122.

It is understood that the semiconductor die 114 may be electrically coupled to the substrate 102 using technologies other than wire bonding. For example, semiconductor die 114 may be a flip-chip which is soldered onto contact pads of the substrate 102. As a further example, conductive leads may be printed by known printing processes between the die bond pads and contact pads to electrically couple the semiconductor die 114 to the substrate 102.

It is understood that order of the steps of mounting the semiconductor die 114 (step 204), mounting the spacer layer 120 (step 208) and wire bonding the semiconductor 114 (step 210) may be performed in different orders in further embodiments. For example, the spacer layer may be mounted first, and the semiconductor die 114 may then be mounted and wire bonded. As a further example, the semiconductor die 114 may be mounted and wire bonded, and thereafter, the spacer layer 120 may be mounted.

Figure 15:
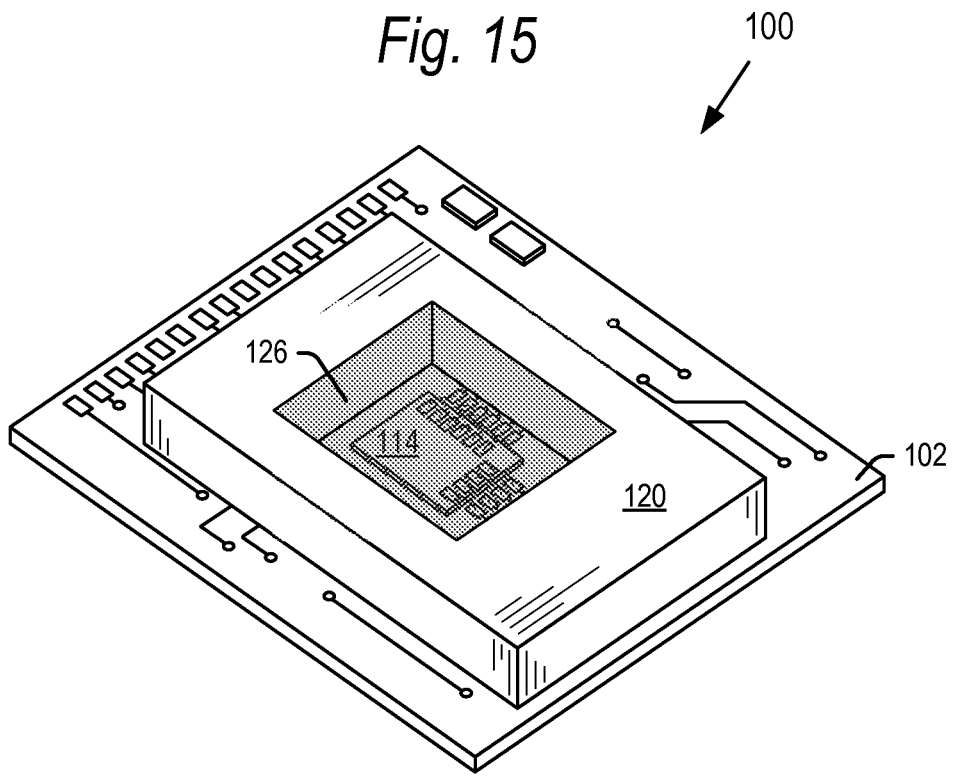
FIG. 15 is a perspective view of a further stage in the fabrication of a semiconductor device according to an embodiment of the present technology.

In step 212, the aperture 122 may be filled with a liquid compound 126 as shown in FIG. 15. The liquid compound 126 may be applied as an A-stage compound, and thereafter cured to either a B-stage or C-stage. In one example, the liquid compound 126 may be an epoxy sold under the product number Dover DE109H from Shenzhen Dover Technology Co., Ltd having a place of business in Shenzhen, China. Other epoxies and compounds may be used. In one embodiment, the liquid compound 126 may have a coefficient of thermal expansion approximating that of the spacer layer 126. This may prevent separation between the liquid compound 126 and spacer layer 120, or cracking of the spacer layer, upon heating of those components for example by the semiconductor die 114. The coefficient of thermal expansion of the liquid compound 126 and spacer layer 120 may be different in further embodiments.

The liquid compound 126 may protect the semiconductor die 114, and prevent delamination of the memory die stack mounted on the spacer layer 120 as explained below. In particular, if the aperture 122 were left open, air in the aperture may heat upon heating of semiconductor die 114 and expand, thereby possibly delaminating the memory die stack. However, in further embodiments, it is contemplated that liquid compound 126 be omitted, and the aperture 122 left open.

Figure 16:
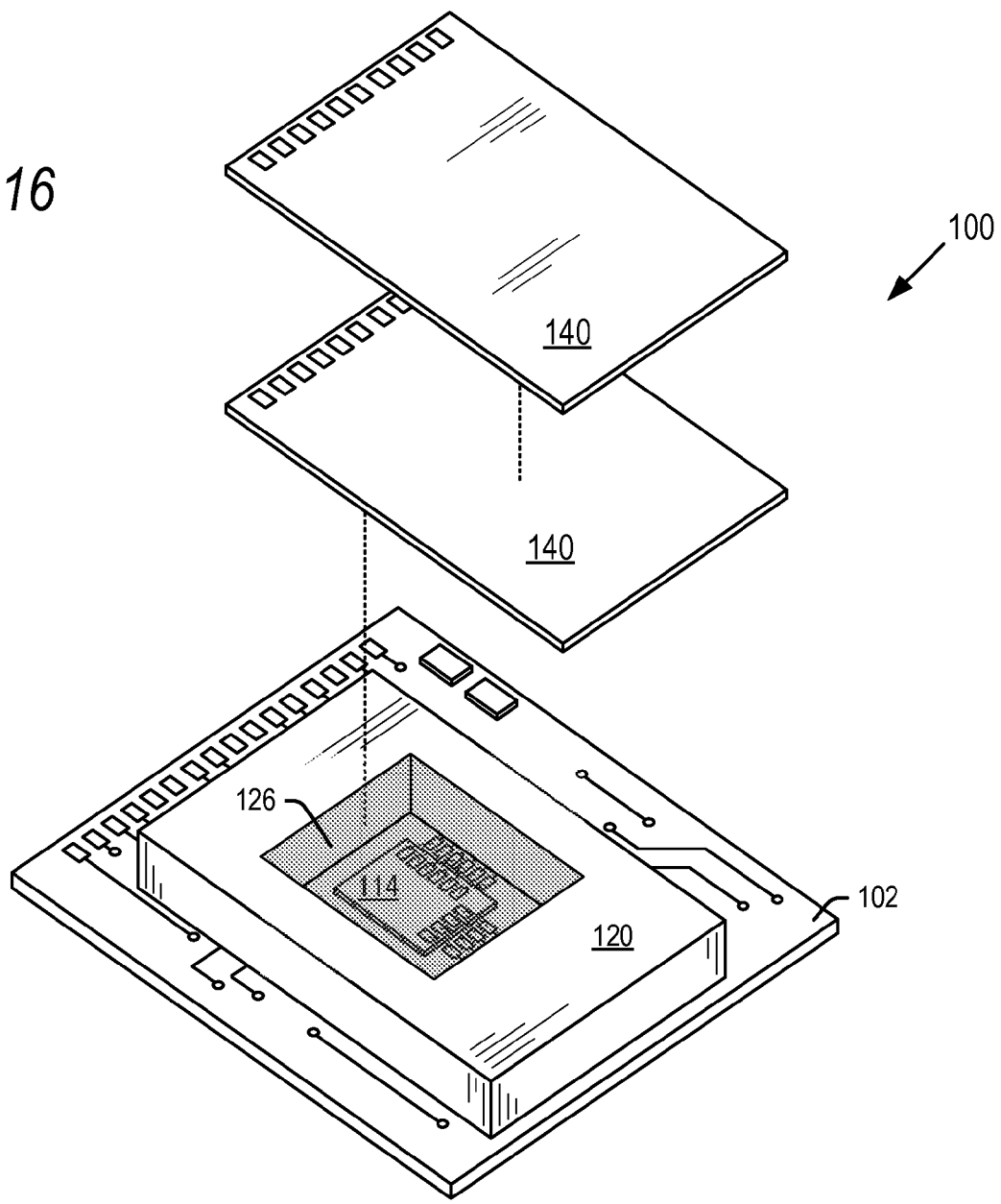
FIG. 16 is a perspective view of a further stage in the fabrication of a semiconductor device according to an embodiment of the present technology.
Figure 17:
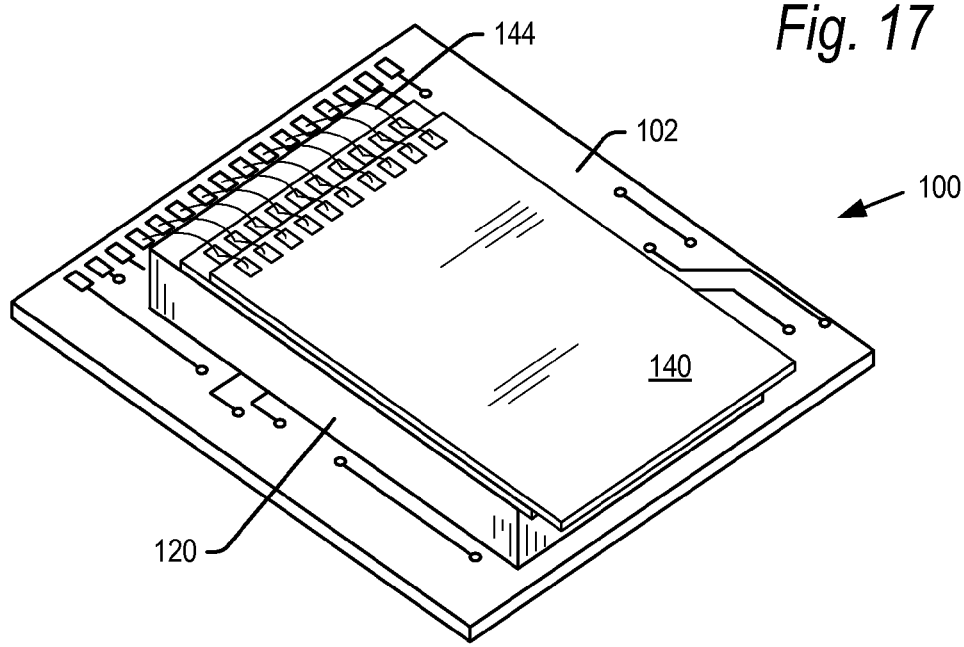
FIG. 17 is a perspective view of a further stage in the fabrication of a semiconductor device according to an embodiment of the present technology.

In step 214, one or more semiconductor die 140 may be stacked on top of the spacer layer 120 and liquid compound 126 as shown in FIGS. 16 and 17. The semiconductor die 140 may be stacked in stepped configuration. While two such semiconductor die 140 are shown, there may be a single semiconductor die 140 or more than two semiconductor die in the die stack in further embodiments. Semiconductor die 140 may include integrated circuits 142 functioning for example as memory die and more preferably NAND flash memory die, but other types of semiconductor die are contemplated.

In step 216, the semiconductor die 140 may be wire bonded to contact pads 108 on the substrate 102 via wire bonds 144 in a known wire bonding process, using for example a wire bond capillary (not shown).

Figure 18:
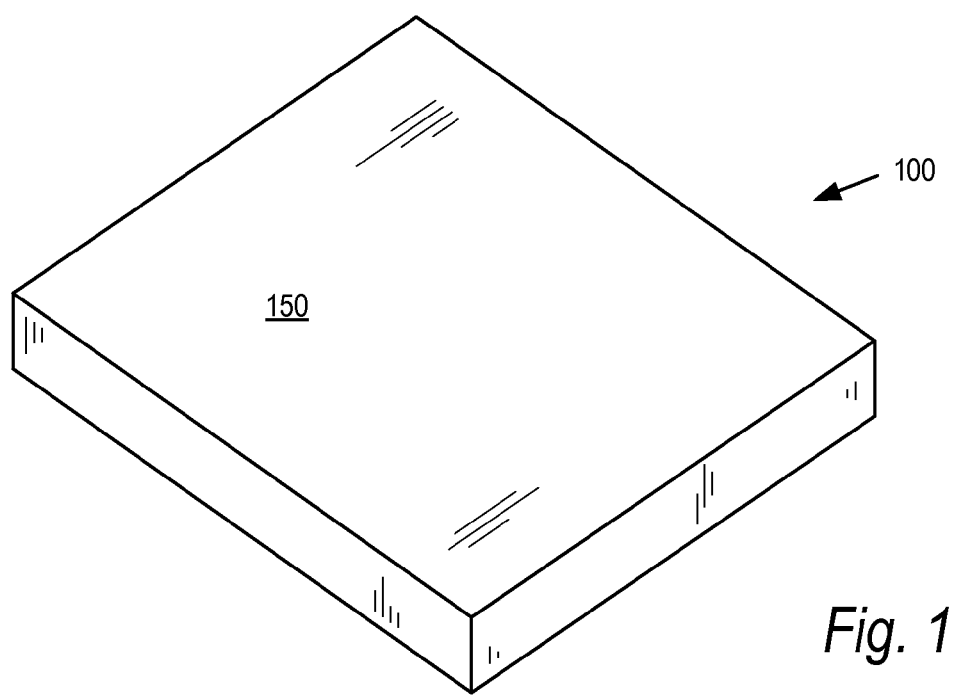
FIG. 18 is a perspective view of a further stage in the fabrication of a semiconductor device according to an embodiment of the present technology.

After the die stack is formed and wire bonded to contact pads 108 on the substrate 102, the semiconductor device 100 may be encased within the molding compound 150 in step 220, and singulated from the panel in step 224, to form a finished semiconductor device 100 as seen in FIG. 18. Molding compound 150 may be a known epoxy such as for example available from Sumitomo Corp. and Nitto Denko Corp., both having headquarters in Japan. Thereafter, the device 100 may undergo electrical test and burn-in in step 226. In some embodiments, the finished semiconductor device 100 may optionally be enclosed within a lid (not shown) in step 228.

The semiconductor device 100 may be used as an LGA (land grid array) package so as to be used as removable memory within a host device. In such embodiments, contact fingers (not shown) may be formed on a lower surface of the substrate 102 for mating with pins in a host device upon insertion of the semiconductor device 100 in the host device. Alternatively, the semiconductor device 100 may be used as a BGA (ball grid array) package so as to be permanently affixed to a printed circuit board within a host device. In such embodiments, solder balls (not shown) may be formed on contact pads on a lower surface of the substrate 102 for being soldered onto a printed circuit board of a host device.

The spacer layers 120 including apertures 122 allow the semiconductor die 114, for example a controller, to be mounted on the surface of the substrate 102, while providing a large, flat surface for mounting of additional semiconductor die, for example memory die.

Moreover, forming the spacer layer from a semiconductor wafer provides further advantages. For example, as mentioned above, semiconductor device fabrication facilities typically have resources for handling and processing semiconductor wafers. The vacuum chucks used to hold the wafer 300 as it is processed, the equipment for applying the die attach film to the surface of wafer 300, the wafer dicing equipment to cut the wafer 300 into respective spacer layers 120, and the pick and place robots for transferring the diced spacer layers onto the substrate 102 all commonly exist in a semiconductor device fabrication facility for handling other semiconductor wafers. This allows easy fabrication of the spacer layers 120 with little additional cost to the facility.

Additionally, by forming the spacer layers 120 from a semiconductor wafer, the spacer layers 120 may be made from the same material as the semiconductor die 140. For example, semiconductor die 114 may generate heat when operating, and this heat may cause the spacer layer 120 and semiconductor die 140 to expand. As the spacer layer 120 and semiconductor die 140 may be of the same material, they may have the same coefficient of thermal expansion. Thus, when the semiconductor die 114 heats the spacer layer and semiconductor die on the spacer layer, they will expand to the same degree. It is understood that spacer layer 120 may be formed of materials other than semiconductor materials. Some of these materials may have a coefficient of thermal expansion which is the same as or similar to semiconductor materials to prevent thermal mismatch.

In the description above, spacer layer 120 is not processed to include integrated circuits. However, in further embodiments, the spacer layer 120 may be a semiconductor die with integrated circuits, but one which is not functioning as an electrical component. For example, it may happen that a semiconductor wafer is determined to be defective after forming the integrated circuits, or at any stage in the processing of integrated circuits, for a variety of reasons. Some defects adversely impact the electronic function of the semiconductor die on the wafer, while other defects are catastrophic so that the semiconductor die on the wafer cannot be used for their electronic function.

For example, memory die may be classified in bins, depending on the degree of electronic functionality. Known good die (Bin 1) have full electronic functionality, while other memory die (e.g., Bin AA or ZZ) have partial functionality due to some defect, but still may be used as memory die, albeit with reduced storage capacity. Semiconductor die which have electronic functionality (full or partial) are referred to herein as "functioning semiconductor die," as opposed to completely defective semiconductor die. At present, the yield of semiconductor wafers with completely defective semiconductor die is somewhere around 5%. Given the millions of wafers that are fabricated, this results in a large number of semiconductor wafers and die that are unusable for their electronic function.

In accordance with embodiments of the present technology, instead of discarding wafers with completely defective semiconductor die, the semiconductor die of these wafers may be reclaimed and used as spacer layers 120. These semiconductor die are referred to herein as reclaimed semiconductor die. FIG. 19 illustrates a completely defective semiconductor die 130, and FIG. 20 illustrates the same die, used as a reclaimed semiconductor die 132. FIGS. 19 and 20 illustrate a single semiconductor die from wafer 300, but some or all of the remaining semiconductor die on wafer 300 may also be completely defective and used as reclaimed semiconductor die 132. The illustrated reclaimed semiconductor die 132 includes integrated circuits 134 and die bond pads 136, but due to some catastrophic defect, the reclaimed semiconductor die 132 is not usable as an electronic component.

Where semiconductor die from a wafer are determined to be completely defective, they may be reclaimed and used as spacer layers 120 which need not be wire bonded to the substrate 102. FIG. 20 illustrates a wafer 300 including a reclaimed semiconductor die 132 having an aperture 122. Apertures 122 may be formed through the respective reclaimed semiconductor die 132 of the wafer 300 as explained above, and the wafer diced into spacer layers 120. Reclaimed semiconductor die 132 may include the unused integrated circuits 134 when used as spacer layers 120. In a further embodiment, the integrated circuits 134 may be sanded off of a defective wafer before or after formation of the apertures 122, and then the wafer diced into spacer layers 120 and used as explained above. While FIGS. 19 and 20 show formed integrated circuits 134, it is understood that a wafer may be determined to be completely defective at any stage in the fabrication of integrated circuits 134, and thereafter reclaimed as spacer layers 120.

In embodiments, the wafer as a whole may be determined to be completely defective, and all of the semiconductor die in that wafer may be reclaimed as spacer layers 120. However, in further embodiments, after fabrication of the integrated circuits 134 on the wafer 300 is completed, it may be determined that some of the semiconductor die are completely defective, while others are functioning semiconductor die. In such an embodiment, the functioning semiconductor die may be used as electronic components in accordance with their proper electronic functionality. On the other hand, those semiconductor die in the wafer 300 determined to have failed integrated circuits may be reclaimed and used as spacer layers 120.

In this embodiment, a wafer map may be developed having a map of the positions of functioning semiconductor die and completely defective semiconductor die. Using the wafer map, apertures 122 may be formed in the completely defective semiconductor die, while no apertures 122 are formed in the functioning semiconductor die. As noted above, the positions all die on the wafer are known, and the positions of the apertures (for example for those die to receive apertures) have been aligned to the semiconductor die. Accordingly, using the known positions of completely defective die from the wafer map, and using the known alignment of the apertures 122 within those semiconductor die, apertures 122 may be formed in the completely defective semiconductor die using techniques described above. The functioning semiconductor die may be left without apertures. In some embodiments, the functioning semiconductor die may be shielded with a protective layer while the apertures are formed in the completely defective semiconductor die, which protective layer is removed after formation of the apertures.

After formation of the apertures 122 in the completely defective die, the wafer may be diced as explained above. Upon dicing of the wafer, a pick and place robot may remove the functioning semiconductor die for use as electronic components, and a pick and place robot may remove the reclaimed semiconductor die for use as spacer layers 120. In a further alternative embodiment, the functioning semiconductor die may be removed from the wafer before apertures are formed in the completely defective die. In this embodiment, the wafer may be diced, and then, using the known positions of functioning semiconductor die, a pick and place robot may remove the functioning semiconductor die. Thereafter, the apertures may be formed in the remaining, completely defective semiconductor die as explained above. A pick and place robot may then remove those die for use as spacer layers 120. Using the reclaimed semiconductor die 132 of the above-described embodiments, spacer layers 120 may be formed with no additional material costs and minimal additional processing costs.

In embodiments described above, a single semiconductor die 114 such as a controller may be mounted to the substrate 102, and then enclosed within the aperture 122 of the spacer layer 120. However, it is understood that different semiconductor die (including for example DRAM, NAND or other smaller memory die) and/or other electronic components may be mounted on the substrate and positioned within aperture 122 in further embodiments. As noted, other semiconductor die and/or other components may be mounted within the aperture 122 in addition to semiconductor die 114 in further embodiments.

FIGS. 23-34 relate to an alternative embodiment of the present technology. FIGS. 23-26 show a conventional state of the art. In particular, a conventional, generally rectangular spacer layer 50 may be mounted on the substrate 26. As noted above, the substrate 26 may also include a substrate-mounted semiconductor die 24 such as a controller. As seen for example in prior art FIG. 24, the width of the conventional spacer layer 50 is limited by the semiconductor die 24 and its wire bonds to the substrate.

Figure 26:
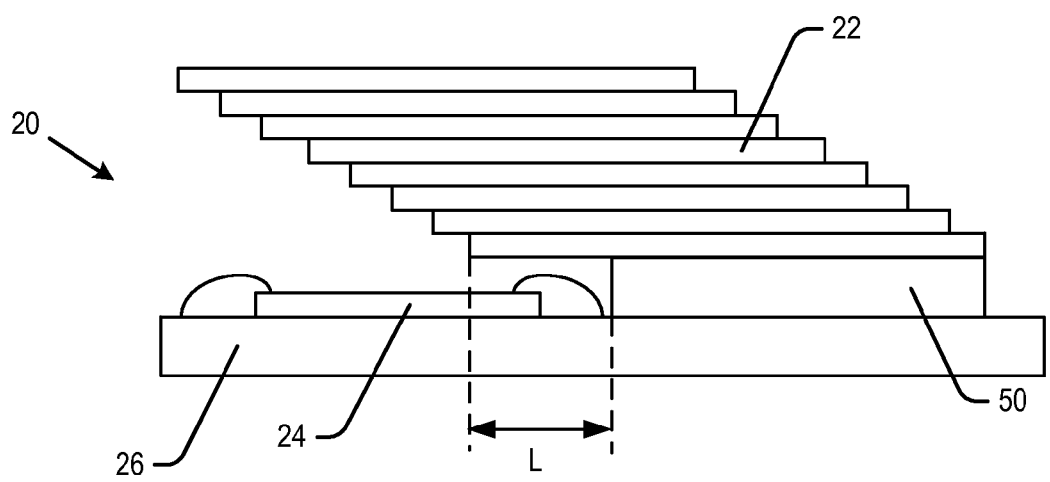

The design of this conventional spacer layer 50 is problematic in that, when semiconductor die 22 such as memory die are mounted on top of the spacer layer 50, the bottommost semiconductor die 22 overhangs the edge of the spacer layer 50 by a distance L, as shown in prior art FIG. 26. As loads are exerted downward on the die stack, such as for example during encapsulation, this overhang of the bottommost semiconductor die creates a cantilevered effect on the bottom most semiconductor die. This cantilevered effect generates stresses in the bottommost semiconductor die at the line where it overhangs the spacer 50, which stresses can damage or crack the bottommost semiconductor die.

Figure 27:
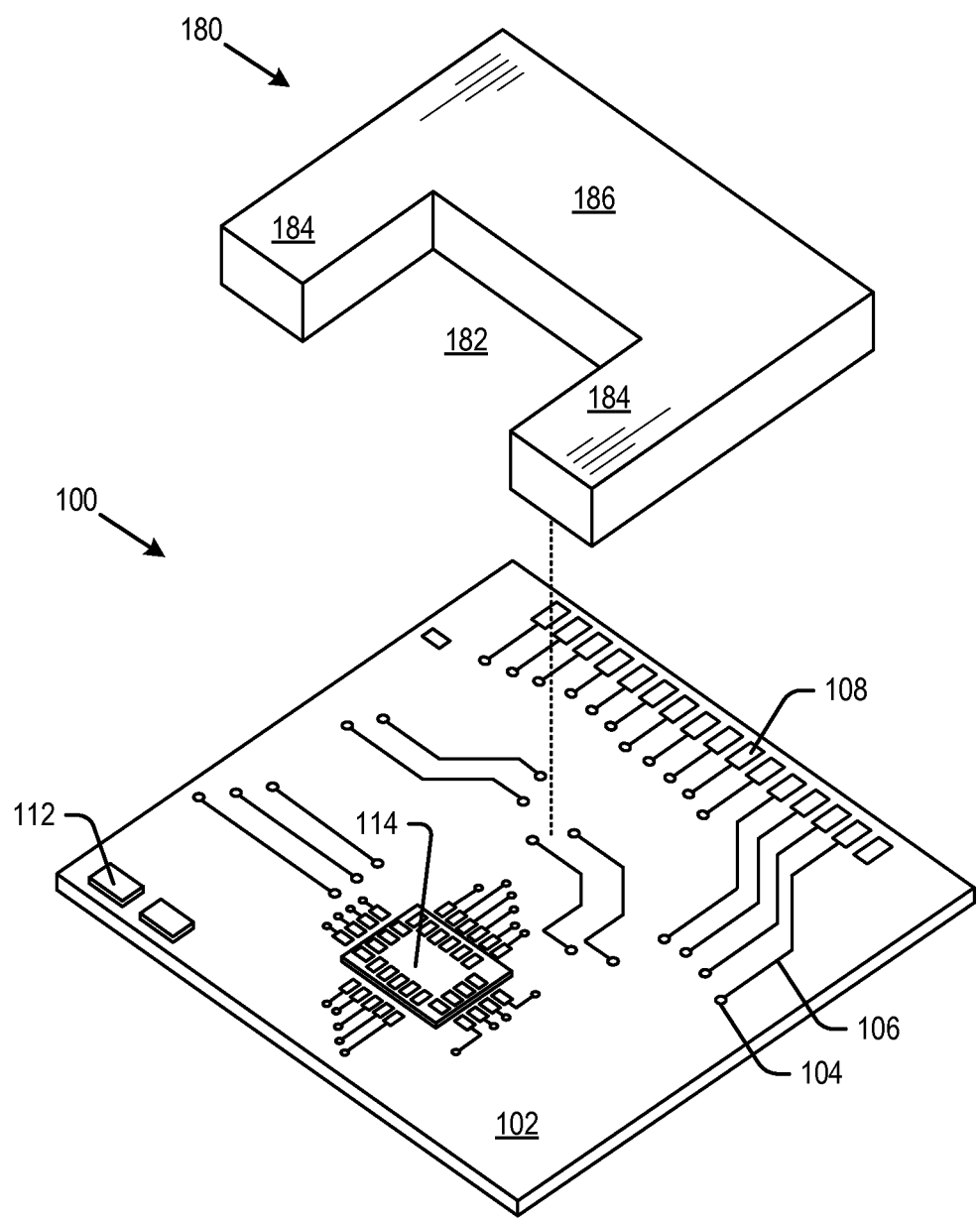
FIG. 27 is a perspective view of a substrate and substrate-mounted semiconductor die together with a spacer layer according to a further embodiment of the present technology.

FIG. 27 illustrates a substrate 102 including vias 104, traces 106 contact pads 108 and passive components 112 as described above. Substrate 102 further includes a semiconductor die 114 surface mounted to the substrate 102 as described above. FIG. 27 further shows a spacer layer 180 according to a further embodiment of the present technology. Spacer layer 180 includes a notch 182 formed in one edge of the spacer layer 180 defining arm portions 184 extending from a base portion 186.

With the exception of having a notch 182 instead of an aperture 122, spacer layer 180 may be similar in all other respects to any of the embodiments of spacer layer 120 described above. As described above, spacer layer 180 and be formed of semiconductor material, such as for example from the wafer 300 described above, in accordance with aspects of the present technology.

Figure 28:
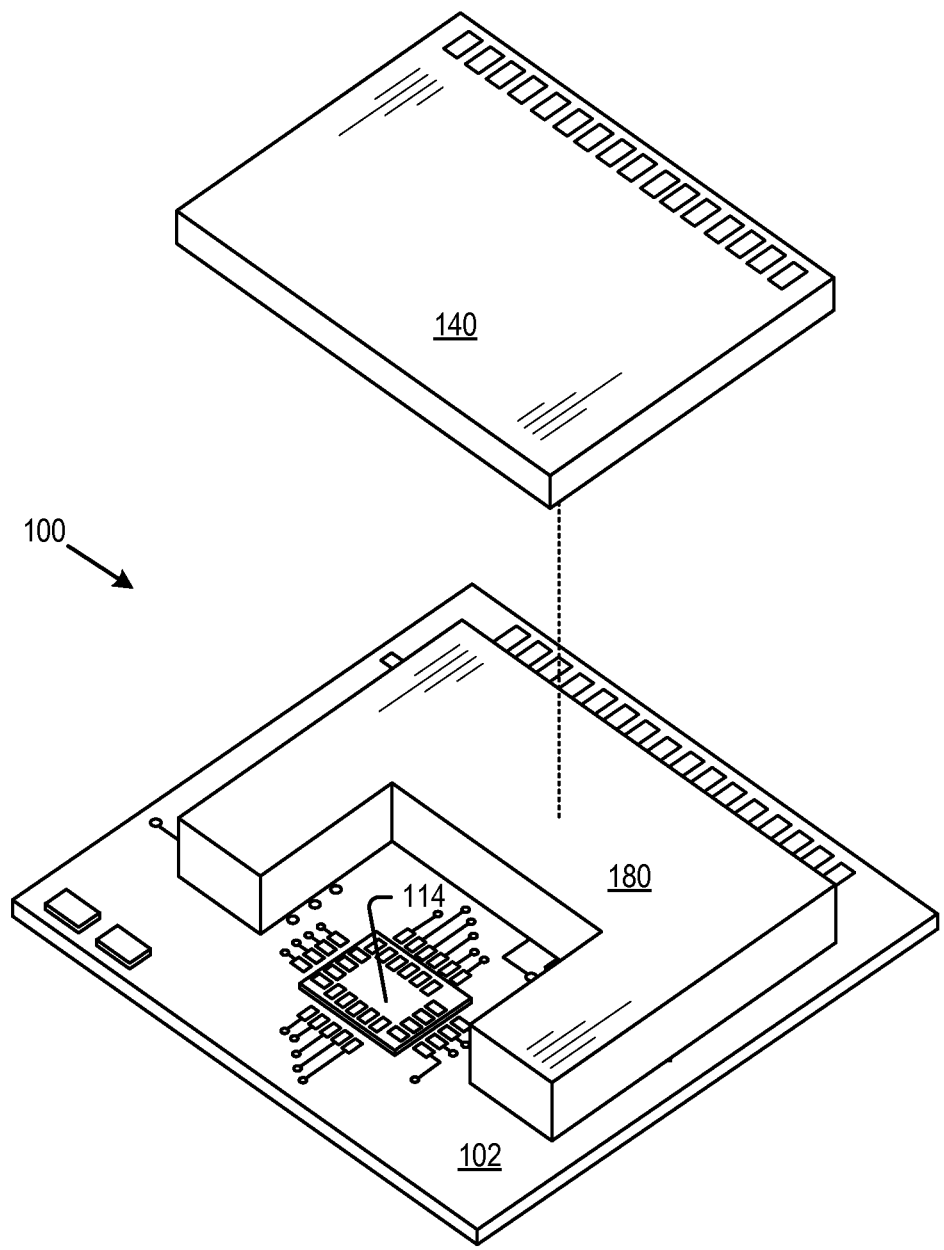
FIGS. 28 and 29 are perspective views of a semiconductor device including the alternative spacer layer of FIG. 27 supporting a semiconductor die over the substrate.
Figure 29:
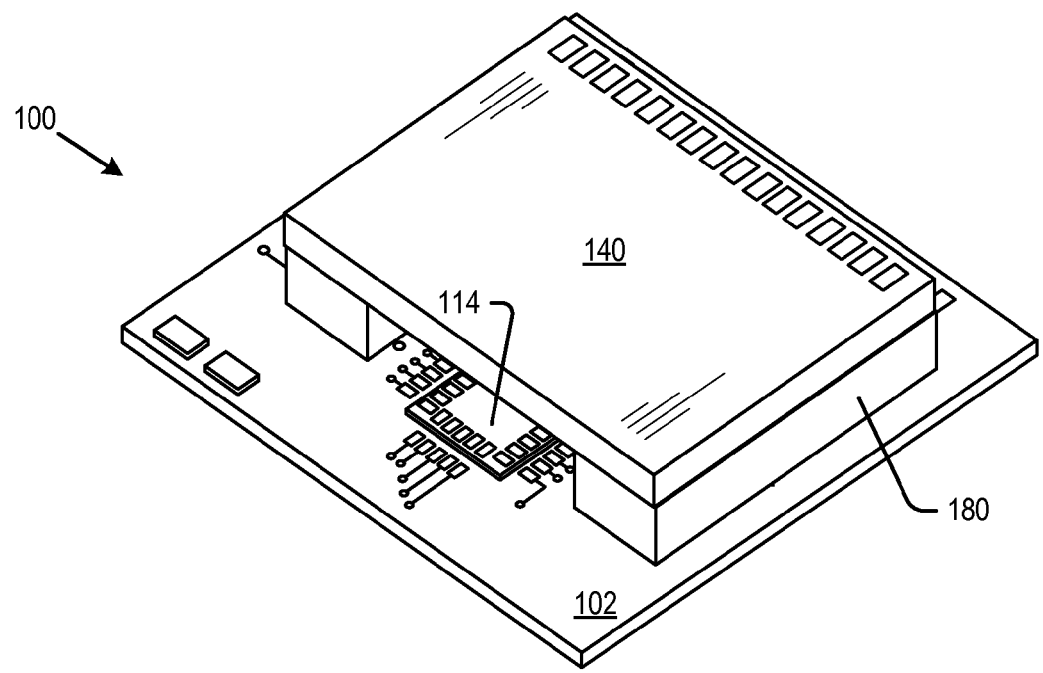
Figure 30:
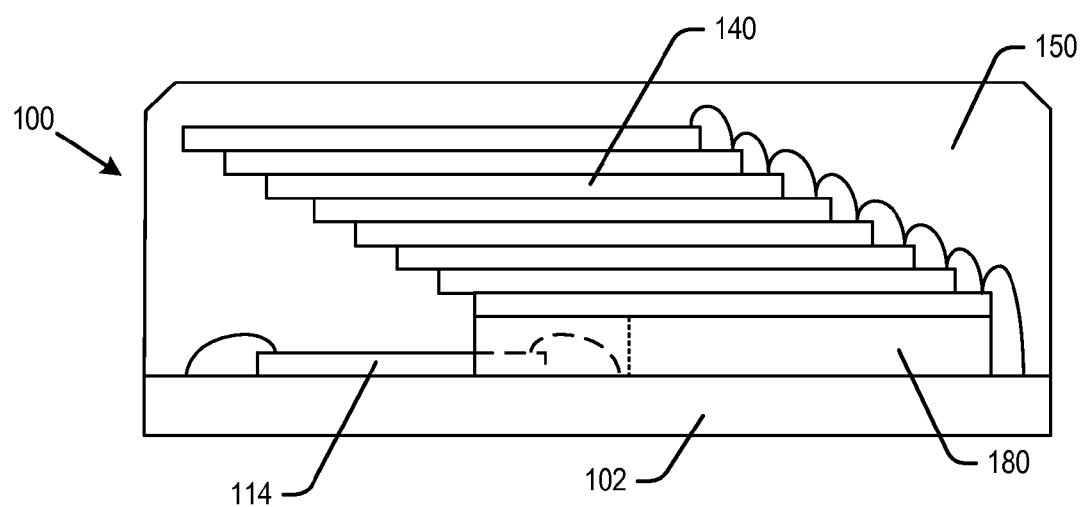
FIG. 30 is a cross-sectional edge view showing a finished semiconductor device including a die stack mounted the alternative spacer layer of FIG. 27.

As shown in FIGS. 28 and 29, one or more semiconductor die 140 may be stacked on top of the spacer layer 180. A single semiconductor die is shown in FIGS. 28 and 29, but maybe more than one in further embodiments. FIG. 30 shows embodiment including eight semiconductor die 140. The semiconductor die 140 may be stacked in stepped configuration. As above, semiconductor die 140 may include integrated circuits functioning for example as memory die and more preferably NAND flash memory die, but other types of semiconductor die are contemplated.

As shown in FIG. 29, the footprint of the spacer layer 180 (i.e., the length and width of the spacer layer 180 without the notch 182) may be the same as the footprint of the bottommost semiconductor die 140. Thus, the cantilever effect and stress found in prior art designs is alleviated by spacer layer 180.

FIG. 30 illustrates a finished semiconductor package 100 fabricated using a spacer layer 180. Semiconductor die 140 added on top of the spacer layer 180 are shown wire bonded to the substrate 102 and the semiconductor device 100 is encapsulated in a molding compound 150, all as described above.

Figure 31:
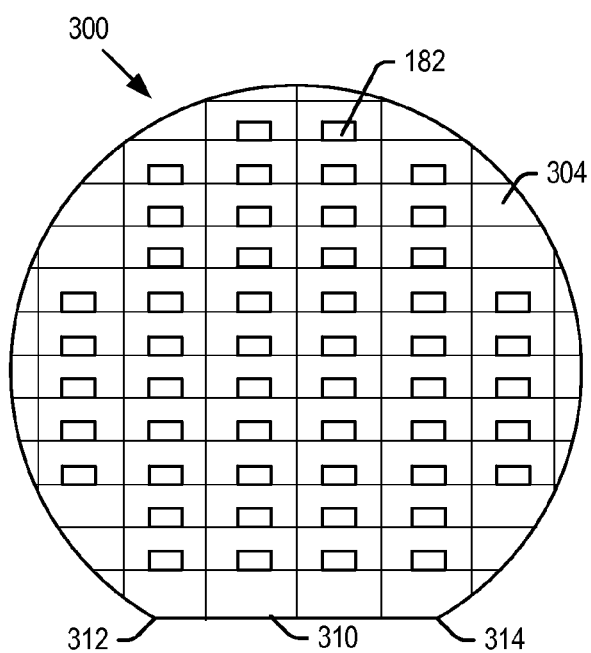
FIG. 31 is a top view of a semiconductor wafer including notches according to embodiment of FIG. 27.
Figure 32:
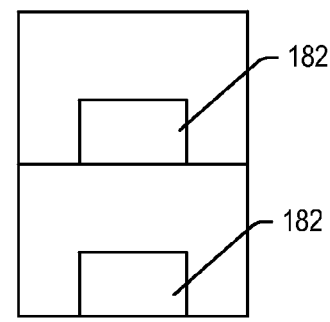
FIG. 32 is an enlarged view of a portion of the wafer shown in FIG. 31.

FIG. 31 illustrates a wafer 300 including notches 182 which may be cut therefrom according to any of the embodiments described above with respect to the manner in which aperture 122 is cut. FIG. 32 illustrates an enlarged portion of wafer 300 showing two semiconductor die with notches 182 cut at an edge of the semiconductor die.

Figure 33:
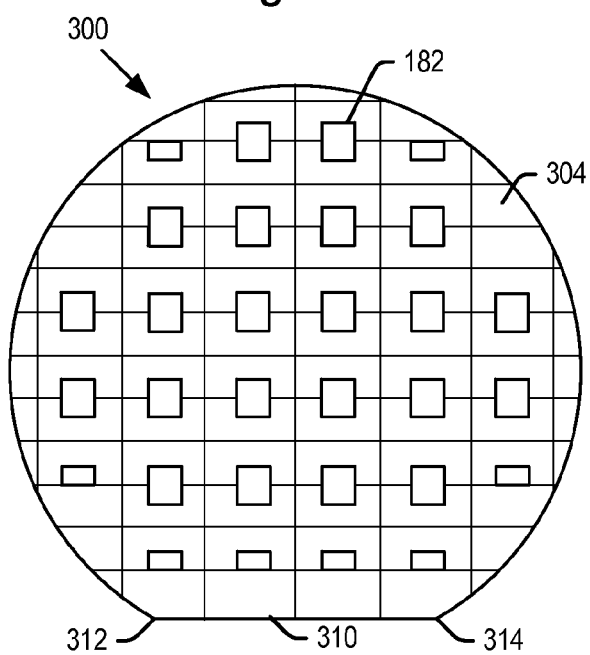
FIG. 33 is a top view of a semiconductor wafer including notches according to embodiment of FIG. 27.
Figure 34:
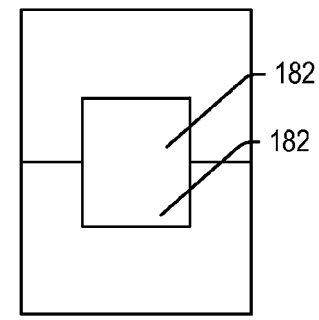
FIG. 34 is an enlarged view of a portion of the wafer shown in FIG. 33.

Given that the notches 182 are formed in the edge of respective semiconductor die, two notches 182 may be cut in a single cutting process, where the notch in a first semiconductor die is at the bottom of the die, and the notch in a below-adjacent semiconductor die is at a top of the die. Such an embodiment is shown in the views of FIGS. 33 and 34. FIG. 33 illustrates a wafer 300 where cuts can be made to form the notches in two adjacent die at the same time. FIG. 34 illustrates an enlarged portion of way for 300 showing a first semiconductor die having a notch 182 in a bottom portion of the die, and a second semiconductor die having a notch 182 in a top portion of the die. This process allows for more efficient cutting of the notches through the wafer 300.

In summary, an example of the present technology relates to spacer layer for a semiconductor device, the spacer layer comprising: a first major surface; a second major surface opposite the first major surface; and one of an aperture and a notch formed through the spacer layer between the first and second major surfaces; wherein a material from which the spacer layer is formed is from a group consisting of a monocrystalline semiconductor element or compound and a polycrystalline semiconductor element or compound.

In another example, the present technology relates to semiconductor device, comprising: a substrate; a first semiconductor die mounted to a surface of the substrate; and a second semiconductor die forming a spacer layer mounted to the surface of the substrate, the spacer layer including an aperture through first and second major opposed surfaces, the first semiconductor die fitting within the aperture of the spacer layer.

In a further example, the present technology relates to a semiconductor device, comprising: a substrate; a first semiconductor die mounted directly to a surface of the substrate; a second, reclaimed semiconductor die comprising at least a portion of an integrated circuit, the reclaimed semiconductor die having a first major surface mounted directly to the surface of the substrate, and the reclaimed semiconductor die including an aperture through the first major surface and a second major surface opposed to the first major surface, the first semiconductor die fitting within the aperture in the reclaimed semiconductor die; and a group of one or more third semiconductor die mounted on the reclaimed semiconductor die.

In another example, the present technology relates to a semiconductor device, comprising: a substrate; a first semiconductor die mounted to a surface of the substrate; and a second semiconductor die forming a spacer layer mounted to the surface of the substrate, the spacer layer including a notch formed in an edge of the second semiconductor die, through first and second major opposed surfaces, the first semiconductor die fitting at least partially within the notch of the spacer layer.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A spacer layer for a semiconductor device, the spacer layer comprising a reclaimed semiconductor die cut from a semiconductor wafer comprising a plurality of semiconductor die, the spacer layer comprising:
   a first major surface;
   a second major surface opposite the first major surface; and
   one of an aperture and a notch formed through the spacer layer between the first and second major surfaces;
   wherein a material from which the spacer layer is formed is from a group consisting of a monocrystalline semiconductor element or compound and a polycrystalline semiconductor element or compound.

2. The spacer layer of claim 1, wherein the material from which the spacer layer is formed is a material from the group consisting of Group IV elemental semiconductors, Group IV compound semiconductors, Group VI elemental semiconductors, III-V semiconductors, II-VI semiconductors, I-VII semiconductors, IV-VI semiconductors, V-VI semiconductors, and II-V semiconductors.

3. The spacer layer of claim 1, wherein the spacer layer is a semiconductor die from a semiconductor wafer.

4. The spacer layer of claim 1, further comprising first and second edges opposite to each other and each extending between the first and second major surfaces, the aperture positioned between the first and second edges.

5. The spacer layer of claim 1, further comprising first and second edges opposite to each other and each extending between the first and second major surfaces, the aperture having a side positioned adjacent one of the first and second edges.

6. A semiconductor device, comprising:
   a substrate;
   a first semiconductor die mounted to a surface of the substrate; and
   a second, reclaimed semiconductor die forming a spacer layer mounted to the surface of the substrate, the spacer layer including an aperture through first and second major opposed surfaces, the first semiconductor die fitting within the aperture of the spacer layer, the first and second semiconductor die being formed of the same material to avoid thermal mismatch between the first and second semiconductor die.

7. The semiconductor device of claim 6, wherein the first semiconductor die is a controller.

8. The semiconductor device of claim 6, further comprising a group of one or more third semiconductor die mounted atop the spacer layer and electrically connected to the substrate.

9. The semiconductor device of claim 8, wherein the one or more third semiconductor die are flash memory die.

10. The semiconductor device of claim 6, wherein the spacer layer is formed from a material from the group consisting of a monocrystalline semiconductor element or compound and a polycrystalline semiconductor element or compound.

11. The semiconductor device of claim 6, wherein the spacer layer is formed from a material from the group consisting of Group IV elemental semiconductors, Group IV compound semiconductors, Group VI elemental semiconductors, III-V semiconductors, II-VI semiconductors, I-VII semiconductors, IV-VI semiconductors, V-VI semiconductors, and II-V semiconductors.

12. The semiconductor device of claim 6, further comprising wire bonds which wire bond the first semiconductor die to the substrate, the wire bonds fitting within the aperture without contacting walls of the spacer layer defining the aperture.

13. The semiconductor device of claim 12, wherein the wire bonds extend off of one of a single side, two sides, three sides or all four sides of the semiconductor die.

14. The semiconductor device of claim 6, further comprising a compound filling the aperture and encapsulating the first semiconductor die, the compound having a surface coplanar with the second major surface.

15. The semiconductor device of claim 14, wherein the compound is a curable epoxy.

16. The semiconductor device of claim 14, wherein the compound is a C-stage epoxy.

17. A semiconductor device, comprising:
   a substrate;
   a first semiconductor die mounted directly to a surface of the substrate;
   a second, reclaimed semiconductor die comprising at least a portion of an integrated circuit, the reclaimed semiconductor die having a first major surface mounted directly to the surface of the substrate, and the reclaimed semiconductor die including an aperture through the first major surface and a second major surface opposed to the first major surface, the first semiconductor die fitting within the aperture in the reclaimed semiconductor die; and
   a group of one or more third semiconductor die mounted on the reclaimed semiconductor die.

18. The semiconductor device of claim 17, wherein the reclaimed semiconductor die comes from a wafer of all reclaimed semiconductor die.

19. The semiconductor device of claim 17, wherein the reclaimed semiconductor die comes from a wafer including reclaimed semiconductor die and known good die.

20. The semiconductor device of claim 17, wherein the material from which the spacer layer is formed is a material from the group consisting of a monocrystalline semiconductor element or compound.

21. The semiconductor device of claim 17, wherein the material from which the spacer layer is formed is a material from the group consisting of Group IV elemental semiconductors, Group IV compound semiconductors, Group VI elemental semiconductors, III-V semiconductors, II-VI semiconductors, I-VII semiconductors, IV-VI semiconductors, V-VI semiconductors, and II-V semiconductors.

22. The semiconductor device of claim 8, further comprising a curable epoxy for filling the aperture, the epoxy hardening to form a solid surface coplanar with an upper surface of the second semiconductor die, the epoxy providing uniform support together with the upper surface of the second semiconductor die for the group of one or more third semiconductor die.

* * * * *